United States Patent [19]

Lidow et al.

[11] Patent Number: 4,705,759

[45] Date of Patent: Nov. 10, 1987

[54] HIGH POWER MOSFET WITH LOW ON-RESISTANCE AND HIGH BREAKDOWN VOLTAGE

[75] Inventors: Alexander Lidow, Manhatta; Thomas Herman, Redondo, both of Calif.

[73] Assignee: International Rectifier Corporation, Los Angeles, Calif.

[21] Appl. No.: 456,813

[22] Filed: Jan. 10, 1983

Related U.S. Application Data

[60] Division of Ser. No. 232,713, Feb. 9, 1981, Pat. No. 4,376,286, which is a continuation of Ser. No. 951,310, Oct. 13, 1978, abandoned.

[51] Int. Cl.$^4$ .................... H01L 21/265; H01L 21/31
[52] U.S. Cl. ........................................ 437/29; 357/20; 357/23.4; 357/41; 357/52; 357/89; 437/30; 437/41; 437/149; 437/150; 437/153; 437/913; 437/931; 437/958; 437/984
[58] Field of Search .................... 29/571, 576 B, 578; 148/1.5, 187, 190; 357/23 VD, 20, 41, 52, 89, 91

[56] References Cited

U.S. PATENT DOCUMENTS

| | | | |
|---|---|---|---|
| 3,909,320 | 9/1975 | Cauge et al. | 148/187 |
| 4,055,884 | 11/1977 | Jambutkar | 29/571 |
| 4,072,975 | 2/1978 | Ishitani | 357/23 VD |
| 4,190,850 | 2/1980 | Tihanyi et al. | 357/23 VD |
| 4,344,081 | 8/1982 | Pao et al. | 29/571 X |

FOREIGN PATENT DOCUMENTS

| | | | |
|---|---|---|---|
| 2136509 | 11/1972 | Fed. Rep. of Germany | 357/23 |
| 48-40814 | 12/1973 | Japan | 357/23 |
| 50-46081 | 4/1975 | Japan | 357/23 |
| 51-85381 | 7/1976 | Japan | 357/23.4 |
| 52-23277 | 2/1977 | Japan | 357/23 |
| 53-74385 | 7/1978 | Japan | 357/23 |

OTHER PUBLICATIONS

Lin et al., "Optimum Load Device for DMOS Integrated Circuits", IEEE J. Solid-State Circuits, vol. SC-11, No. 4, Aug. 1976, pp. 443–452.
Plummer et al., "Monolithic 200-V CMOS Analog Switch, IEEE J. Solid-State Circuits, vol. SC-11, No. 6, Dec. 1976, pp. 809–817.
Sun et al., "Modeling of—LDMOS, VDMOS and VMOS—Transistors", IEEE Trans. Electron Dev., vol. 60-27, No. 2, Feb. 1980, pp. 356–367.

Primary Examiner—William G. Saba
Attorney, Agent, or Firm—Ostrolink, Faber, Gerb & Soffen

[57] ABSTRACT

A high power MOSFET is disclosed in which two laterally spaced sources each supply current through respective channels in one surface of a semiconductor chip which are controlled by the same gate. The channels lead from the source electrodes to a relatively low resistivity region and from there to a relatively high resistivity epitaxially formed region which is deposited on a high conductivity substrate. The drain electrode may be either on the opposite surface of the chip or laterally displaced from and on the same side as the source regions. The epitaxially deposited semiconductor material immediately adjacent and beneath the gate and in the path from the sources to the drain has a relatively high conductivity, thereby to substantially reduce the on-resistance of the device without effecting the breakdown voltage of the device. The breakdown voltage of the device is substantially increased by forming a relatively deep p-type diffusion with a large radius in the n-type epitaxial layer beneath each of the sources.

7 Claims, 11 Drawing Figures

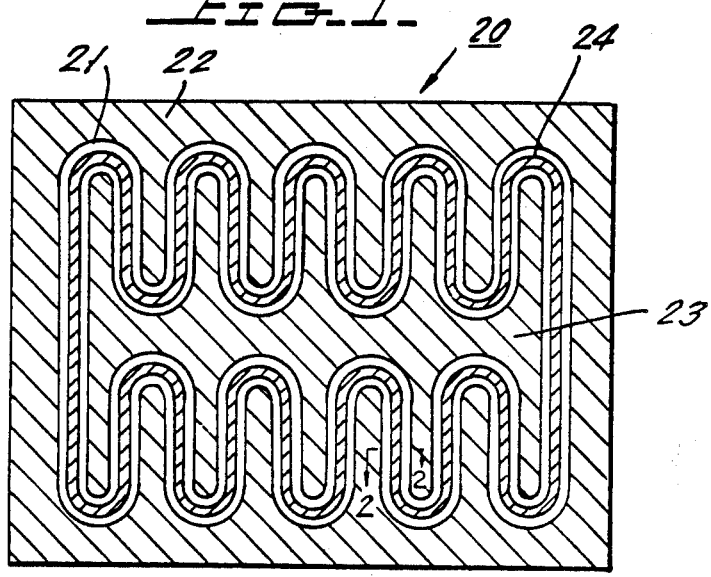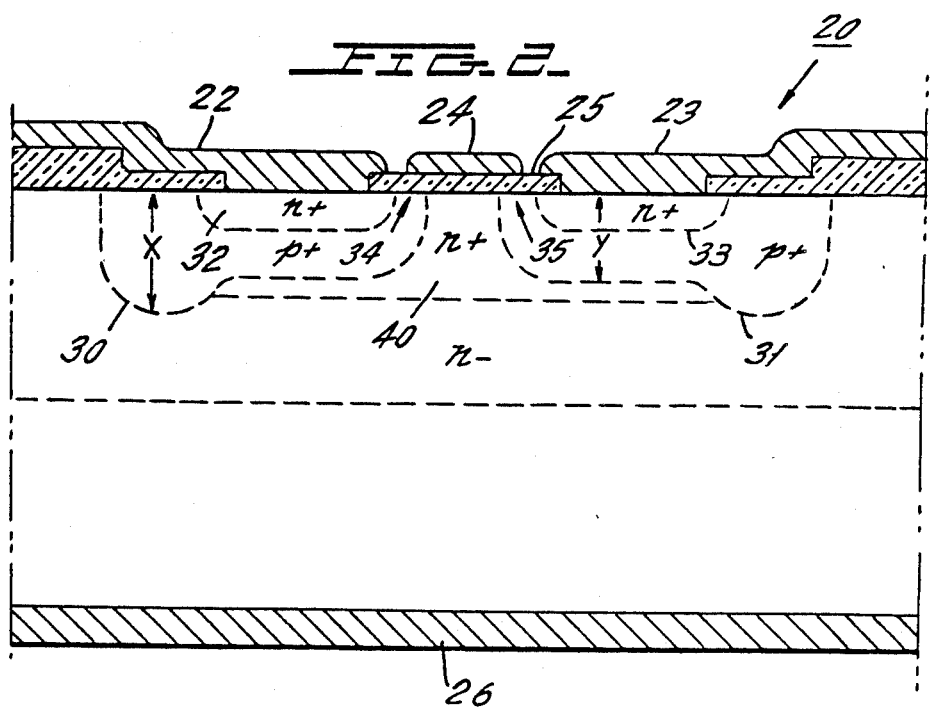

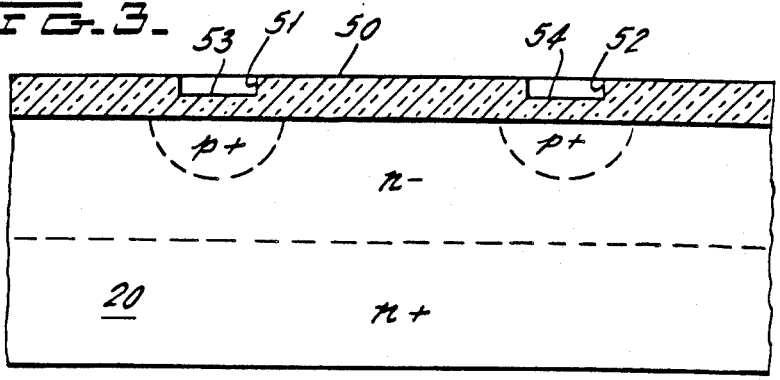
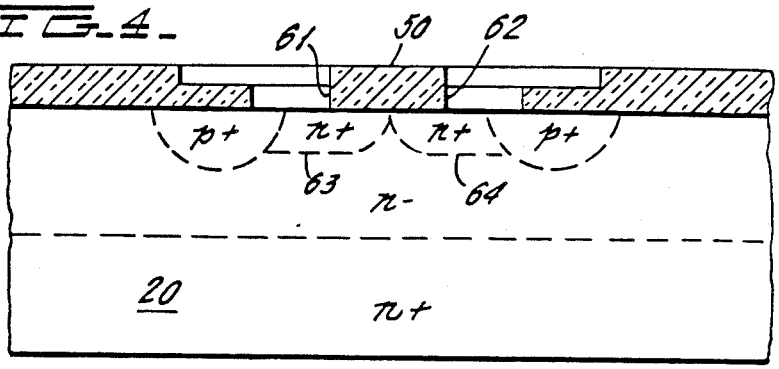
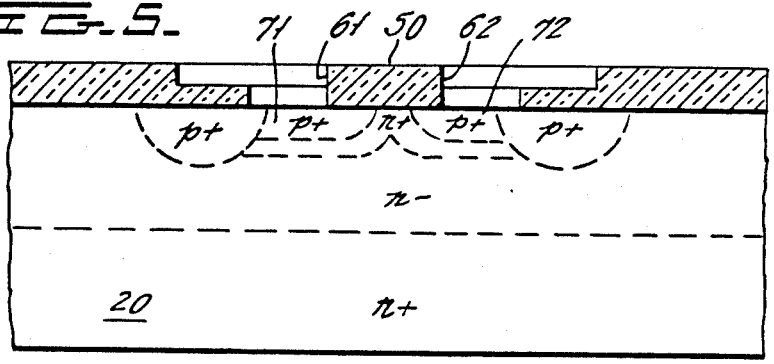
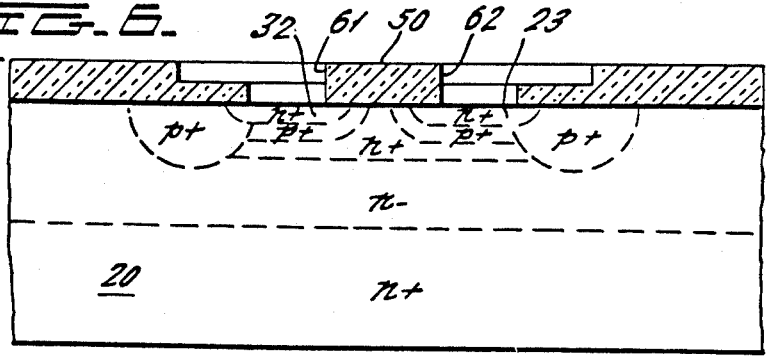

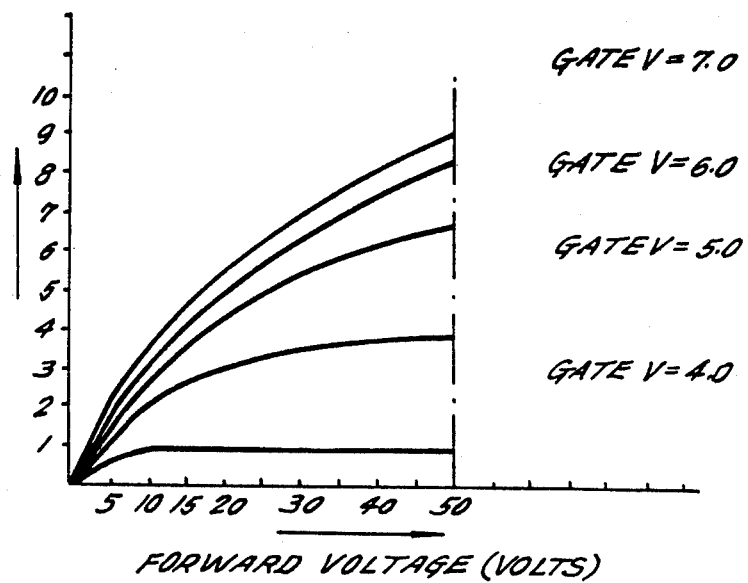

HIGH POWER MOSFET WITH LOW ON-RESISTANCE AND HIGH BREAKDOWN VOLTAGE

This application is a division of application Ser. No. 232,713, filed Feb. 9, 1981, now U.S. Pat. No. 4,376,286, issued Mar. 8, 1983, which, in turn, is a continuation of application Ser. No. 951,310, filed Oct. 13, 1978, now abandoned.

BACKGROUND OF THE INVENTION

This invention relates to MOSFET devices and more specifically relates to a novel structure for a MOSFET device which permits it to be used in high power applications with a relatively high reverse voltage and with an exceptionally low on-resistance. The major advantage of the bipolar transistor over the MOSFET transistor is that the bipolar transistor has a very low on-resistance per unit conductive area. The MOSFET transistor has numerous advantages over the bipolar transistor including very high switching speed, very high gain and lack of the secondary breakdown characteristics exhibited by a minority carrier device. However, because the MOSFET transistor has high on-resistance, its use in high power switching applications has been limited.

BRIEF DESCRIPTION OF THE INVENTION

The present invention provides a novel high power MOSFET device which has a low forward resistance so that the device becomes more competitive with bipolar devices in a switching type application while retaining all of the numerous advantages of the MOSFET over the bipolar device. In particular, with the present invention, the forward resistance per unit area of the device has been reduced by at least a factor of two, compared to the limiting resistance per unit area previously existing in a MOSFET type device.

In one embodiment of the invention, two sources are placed on the same surface of a semiconductor wafer and are laterally spaced from one another. A gate electrode, deposited on a conventional gate oxide, is disposed between the sources. Two p-type conduction channels are disposed beneath the gate and are spaced from one another by an n-type bulk region. Current from each source can flow through its respective channel (after the creation of the inversion layer defining the channel), so that majority carrier conduction current can flow through the bulk region and across the wafer or chip to the drain electrode. The drain electrode may be on the opposite surface of the wafer or on a laterally displaced surface region from the source electrodes. This configuration is made using the desirable manufacturing techniques of the D-MOS device, which permits precise alignment of the various electrodes and channels and permits use of extremely small channel lengths. While the above configuration may have been previously described for a MOSFET signal-type device, the structure is not that of the commonly used signal MOSFET.

The device is basically formed in an n(−) substrate which has the relatively high resistivity which is necessary to obtain the desired reverse voltage capability of the device. For example, for a 400 volt device, the n(−) region will have a resistivity of about 20 ohm centimeters. However, this same necessary high resistivity characteristic has caused the on-resistance of the MOSFET device, when used as a power switch, to be relatively high.

In accordance with the present invention, it has been found that in the upper portion of the central bulk region to which the two inversion layers feed current in the path to the drain electrode, the central region immediately beneath the gate oxide can be a relatively low resistivity material formed, for example, by an n(+) diffusion in that channel region, without affecting the reverse voltage characteristics of the device.

More specifically, and in accordance with the invention, this common channel will have an upper portion beneath the gate oxide and a lower bulk portion extending toward the drain electrode. The lower portion has the high resistivity desired to produce high reverse voltage ability, and will have a depth dependent on the desired reverse voltage for the device. Thus, for a 100 volt device, the lower n(−) region may have a depth of about 35 microns, while for a 90 volt device it will have a depth of about 8 microns. Other depths will be selected, depending on the desired reverse voltage of the device to provide the necessary thicker depletion region required to prevent punch-through during reverse voltage conditions. The upper portion of the common channel is made highly conductive (n+) to a depth of from about 3 to about 6 microns. It has been found that this does not interfere with the reverse voltage withstand ability of the device. However, it decreases the on-resistance per unit area of the device by more than a factor of two. The resulting device becomes competitive with conventional high power bipolar switching devices since it retains all of the advantages of the MOSFET device over the bipolar device but now has the relatively low forward resistance which was the major characterizing advantage of the bipolar device.

In accordance with another feature of the present invention, the p-type region which defines the channel beneath the gate oxide has a relatively deeply diffused portion beneath the source so that the p-type diffusion region will have a large radius of curvature in the n(−) opitaxial layer forming the body of the device. This deeper diffusion or deeper junction has been found to improve the voltage gradient at the edge of the device and thus permits the use of the device with higher reverse voltages.

BRIEF DESCRIPTION OF THE DRAWINGS

FIG. 1 is a plan view of a high power MOSFET chip which incorporates the present invention and particularly illustrates the metalizing patterns of the two sources and the gate.

FIG. 2 is a cross-sectional view of FIG. 1 taken across the section line 2—2 in FIG. 1.

FIG. 3 is a cross-sectional view similar to FIG. 2 showing the initial step in the process of manufacture of the chip of FIGS. 1 and 2 and particularly shows the p(+) conductivity implant and diffusion step.

FIG. 4 shows the second step in the manufacturing process and shows the n(+) implant and diffusion step.

FIG. 5 shows a further step in the process of manufacture of the chip of FIGS. 1 and 2 and shows the channel implant and diffusion step.

FIG. 6 shows a further step in the process of manufacture and illustrates the source predeposition and diffusion step. This precedes the last step in which the gate oxide is cut for the metalization step which produces the device of FIG. 2.

FIG. 9 shows the shape of forward-current characteristics of a device like that of FIG. 2 where the region 40 beneath the oxide is n(−).

FIG. 10 shows the shape of the characteristic of a device identical to that of FIG. 2 where the region 40 has high n(+) conductivity.

DETAILED DESCRIPTION OF THE DRAWINGS

Figure 7:
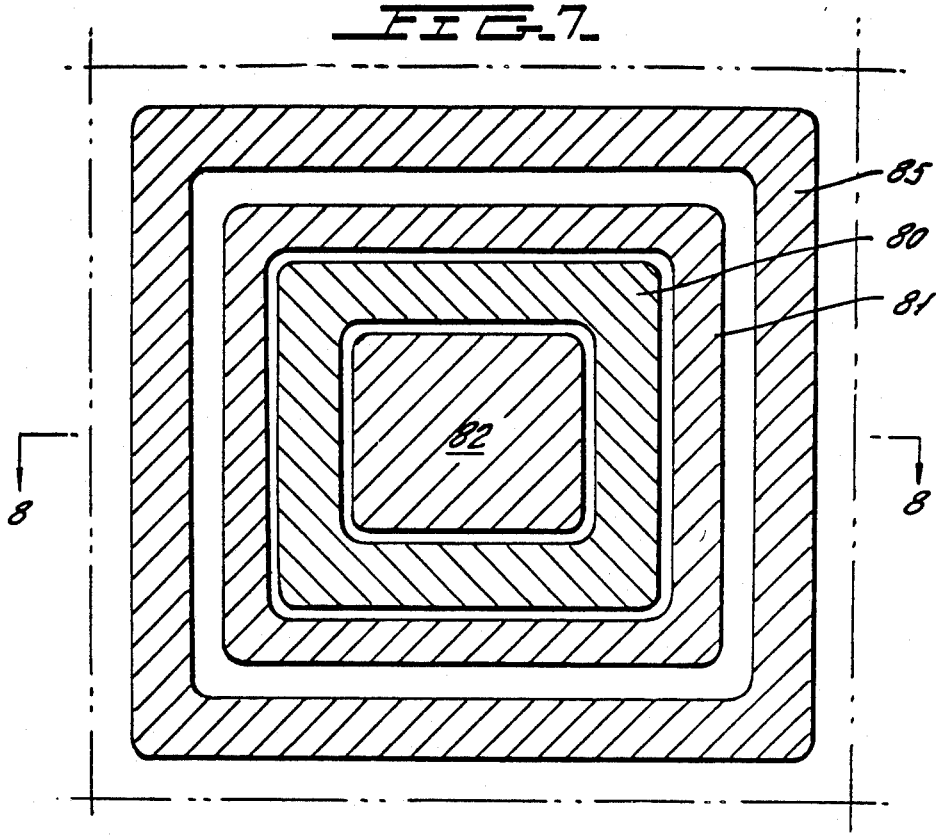
FIG. 7 is a plan view of the metalizing pattern of a second embodiment of the invention.

A first embodiment of the novel MOSFET device of the present invention is shown in FIGS. 1 and 2 which show a chip of monocrystalline silicon 20 (or some other suitable material), with the device electrodes following the serpentine path 21 best shown in FIG. 1 in order to increase the current-carrying area of the device. Other geometries could be used. The device illustrated has a reverse voltage of about 400 volts and an on-resistance less than about 0.4 ohm with a channel width of 50 centimeters. Devices having reverse voltages of from 90 to 400 volts have been made. The 400 volt devices have carried pulse currents of 30 amperes. The 90 volt devices have had forward on-resistances of about 0.1 ohm with a channel width of 50 centimeters and have carried pulse currents up to about 100 amperes. Higher and lower voltage devices can also be made with varying channel widths.

Presently known MOSFET devices have much higher on-resistances than the above. For example, a 400 volt MOSFET comparable to that described below but made with prior art techniques would normally have an on-resistance much greater than about 1.5 ohms, as compared to an on-resistance less than about 0.4 ohm in a device made according to this invention.

Moreover, the MOSFET switching device of the present invention will exhibit all of the desirable advantages of the MOSFET device, since it operates as a majority carrier device. These advantages include high switching speed, high gain and avoidance of the secondary breakdown characteristics which exist in minority carrier devices.

The device of FIGS. 1 and 2 has two source electrodes 22 and 23 which are separated by a metalized gate electrode 24 which is fixed to but spaced from the semiconductor device surface by a silicon dioxide layer 25. The serpentine path followed by gate oxide 25 has a length of 50 centimeters and has 667 undulations, but is shown more simply in FIG. 1. Other channel widths can be used. Source electrodes 22 and 23 can be laterally extended as shown to serve as field plates to help spread the depletion region created during reverse voltage conditions. Each of source electrodes 22 and 23 supply current to a common drain electrode 26 which is fixed to the bottom of the wafer. The relative dimensions for the device, particularly in thickness, have been grossly exaggerated in FIG. 2 for purposes of clarity. The silicon chip or wafer 20 is formed on an n(+) substrate which may have a thickness of about 14 mils. An n(−) epitaxial layer is deposited on substrate 20 and will have a thickness and resistivity depending on the desired reverse voltage. All junctions are formed in this epitaxial layer which can have a relatively high resistivity. In the embodiment disclosed, the epitaxial layer has a thickness of about 35 microns and a resistivity of about 20 ohm-centimeters. For a 90 volt device, epitaxial layer 20 would be about 10 microns thick and would have a resistivity of about 2.5 ohm-centimeters. A channel width of 50 centimeters is also used to provide the desired current carrying capacity for the device.

In a preferred embodiment of the invention, there is an elongated serpentine p(+) conductivity region beneath each of the source electrodes 22 and 23 which thus extends around the serpentine path shown in FIG. 1. These p(+) regions are shown in FIG. 2 as the p(+) regions 30 and 31, respectively, and are similar to those of the prior art except that the maximum p(+) region depth is greatly exaggerated in order to form a large radius of curvature. This allows the device to withstand higher reverse voltages. By way of example, the depth of regions 30 and 31 is preferably about 4 microns at the dimension X in FIG. 2 and about 3 microns at the dimension Y in FIG. 2.

By using D-MOS fabrication techniques, two n(+) regions 32 and 33 are formed beneath source electrodes 22 and 23, respectively, and define, with the p(+) regions 30 and 31, n-type channel regions 34 and 35, respectively. Channel regions 34 and 35 are disposed beneath the gate oxide 25 and can be inverted by the appropriate application of a biasing signal to the gate 24 in order to permit conduction from the source 22 and the source 23 through the inversion layers into the central region disposed beneath the gate 24 and then to the drain electrode 26. Channels 34 and 35 may each have a length of about 1 micron.

It has previously been thought necessary that the central n(−) region between channels 34 and 35 (and between p(+) regions 30 and 31) should have a high resistivity in order to permit the device to withstand high reverse voltages. However, the relatively high resistivity n(−) material is also a significant contributing factor to the high forward on-resistance of the device.

In accordance with the significant feature of the present invention, a significant portion of this central conducting region is made relatively highly conductive and consists of an n(+) region 40 disposed immediately beneath the gate oxide 25. The n(+) region 40 has a depth of about 4 microns and could range from about 3 microns to about 6 microns. While its exact conductivity is not known, and varies with depth, it is high relative to the n(−) region beneath it. More particularly, region 40 has a high conductivity which would be determined by a total ion implanted dose of from about $1 \times 10^{12}$ to $1 \times 10^{14}$ phosphorus atoms/cm² at 50 KV followed by a diffusion drive at from 1150° C. to 1250° C. for from 30 minutes to 240 minutes. It has been found that by making this region 40 relatively highly conductive n(+) material through a diffusion or other operation, the device characteristics are significantly improved and the forward on-resistance of the device is reduced by a factor greater than two. Moreover, it has been found that the provision of the high conductivity region 40 does not interfere with the reverse voltage characteristics of the device. Accordingly, by making the region beneath the gate oxide 25 and between channels 34 and 35 more highly conductive, the forward on-resistance of the ultimate high power switching device has been significantly reduced and the MOSFET device becomes far more competitive with an equivalent junction-type device while still retaining all of the advantages of the MOSFET majority carrier operation.

In the above description of FIGS. 1 and 2, it has been assumed that the conduction channels 34 and 35 are of p(+) material and are, accordingly, inverted to an n-type conductivity to provide a majority carrier conduction channel from sources 22 and 23 to the central region 40 upon the application of an appropriate gate voltage. Clearly, however, all of these conductivity types could be reversed so that the device could work as a p-channel device rather than an n-channel device as disclosed.

One process by which the device of FIGS. 1 and 2 could be constructed is shown in FIGS. 3 to 6. Referring to FIG. 3, the base wafer 20 is shown as an n(+) material having an n(−) epitaxially deposited region on top thereof. A thick oxide layer 50 is formed on wafer 20 and windows 51 and 52 are opened therein. The open windows 51 and 52 are exposed to a beam of boron atoms in an ion implanting apparatus to form p(+) regions. Thereafter the implanted boron atoms are caused to diffuse deeper into the wafer to form the rounded p(+) concentration region shown in FIG. 3 which might have a depth of about 4 microns. During this diffusion operation, shallow oxide layers 53 and 54 grow over the windows 51 and 52.

As is next shown in FIG. 4, windows 61 and 62 are cut in the oxide layer 50 and an n(+) implant takes place to implant the n(+) regions 63 and 64 into the n(−) epitaxial layer. This n(+) implantation can be carried out with a phosphorus beam. Thereafter, the implanted regions are subjected to a diffusion step to cause the regions 63 and 64 to expand and deepen to a depth of about 3½ microns with a concentration determined by an implantation dose of $1 \times 10^{12}$ to $1 \times 10^{14}$ phosphorus atoms/cm$^2$ followed by a drive for 30 minutes to 4 hours at from 1150° C. to 1250° C. As will be later seen, regions 63 and 64 produce the novel n(+) region which substantially reduces the on-resistance of the device.

It should be noted that the n(+) regions 63 and 64 could, if desired, be epitaxially deposited and need not be diffused. Similarly, the resulting device being described herein could be manufactured by any desired process as would be apparent to those skilled in the art.

The next step in the process is shown in FIG. 5 and is the channel implantation and diffusion step in which the p(+) regions 71 and 72 are formed through the same windows 61 and 62 that were used for the n(+) implantation for regions 63 and 64. The p(+) regions 71 and 72 are formed by implanting with a boron beam to a dose of about $5 \times 10^{13}$ to $5 \times 10^{14}$ atoms/cm$^2$ followed by a diffusion drive for 30 to 120 minutes at 1150° C. to 1250° C.

Thereafter, and as shown in FIG. 6, steps are carried out for the source predeposition and the diffusion of the source regions 32 and 33. This is carried out by a conventional and non-critical phosphorus diffusion step where the diffusion proceeds through the windows 61 and 62 so that the source regions 32 and 33 are automatically aligned relative to the other preformed regions. Thus, the wafer is placed in a furnace and exposed to pocl$_3$ suspended in a carrier gas for from 10 minutes to 50 minutes at a temperature of from 850° C. to 1000° C.

When this step is completed, the basic junction configuration required in FIG. 2 is formed with short p(+) regions disposed beneath the oxide 50 to serve as the conducting channel for the ultimately constructed device and with an n(+) region filling the area between the channels 34 and 35 and between p(+) regions 30 and 31. The manufacturing process then continues from the step of FIG. 6 to the device shown in FIG. 2 wherein the oxide surfaces on top of the chip are suitably stripped and the metalizing patterns for contacts 22, 23 and 24 are formed to establish electrical contacts to the device. The drain contact 26 is applied to the device in a subsequent metalizing operation. Thereafter, the entire device may be appropriately coated with a suitable passivation coating and wire leads are connected to the source electrodes 22 and 23 and the gate 24. The device is then mounted within a suitable protective housing, with the drain electrode fixed to the housing or other conductive support which serves as a drain connection.

Figure 8:
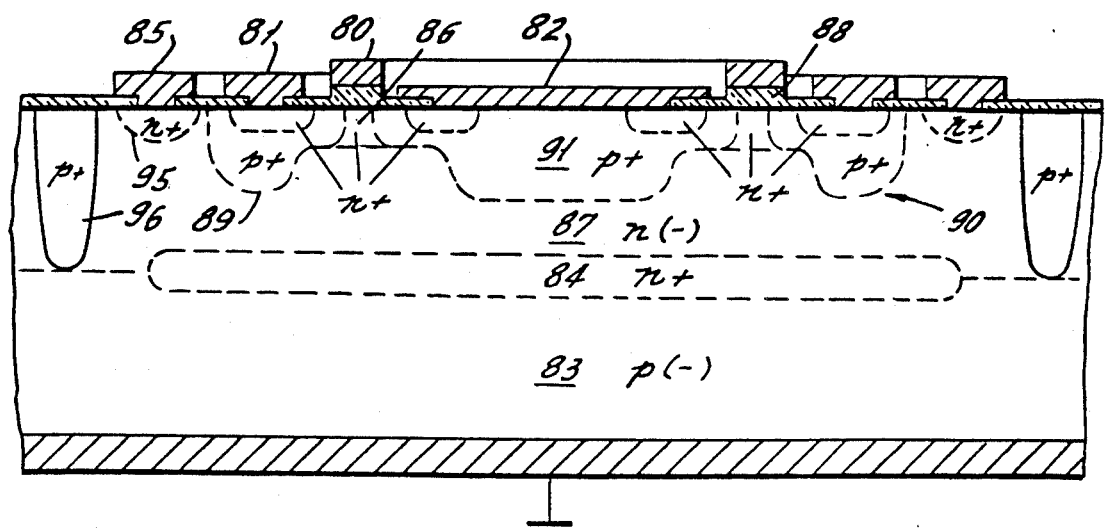
FIG. 8 is a cross-sectional view of FIG. 7 taken across the section line 8—8 in FIG. 7.

The device shown in FIGS. 1 and 2 utilizes a serpentine path for each of the source regions and gate regions and a drain on the surface of the wafer opposite to the source electrodes. Other configurations can be used. FIGS. 7 and 8 illustrate a planar configuration which is a simple rectangular arrangement having a ring-shaped gate 80 which is disposed between a first source electrode 81 of ring shape and a central source 82. The device as shown in FIG. 8 is contained within a base wafer of p(−) monocrystalline silicon 83 which may have a buried n(+) region 84 to reduce the lateral resistance of the various current paths of the device leading to the laterally displaced drain electrode 85 which surrounds source 81.

A ring-shaped n(+) region 86 is formed within the device as shown in FIG. 8 and, in accordance with the present invention, the ring-shaped region 86 is of much higher conductivity than the n(−) epitaxially deposited region 87 which contains all the junctions of the device. The ring-shaped region 86 extends from the region beneath the gate oxide 88 and adjoins the ends of the two conducting channels formed between the ring-shaped p(+) region 89 and the central p(+) region 91 disposed beneath the ring-shaped source 81 and central source 82, respectively.

It will also be noted in FIG. 8 that the outer periphery 90 of the p(+) ring 89 has a large radius to assist the device in withstanding high reverse voltages.

An n(+) region 95 in FIG. 8 is provided to ensure good contact to drain electrode 85. Drain electrode 85 is widely laterally spaced from source 81 (by greater than about 90 microns). The drain contact 85 is surrounded by a p(+) isolation diffusion 96 to isolate the device from other devices on the same chip or wafer.

In the arrangement of FIG. 8, like that of FIG. 2, current flow from sources 81 and 82 goes through the width of epitaxial region 87, through the region 86. The current then flows laterally outward and then up to the drain contact 85. As in the embodiment of FIG. 2, device resistance is greatly reduced by the relatively highly conductive region 86.

In carrying out the above invention, it should be noted that any type of contact material can be used to make the source and gate contacts. By way of example, aluminum could be used for the source electrodes while a polysilicon material can be used for the conductive gate 80 in FIG. 8 or the conductive gate 24 in FIG. 2.

Numerous other geometries can be used to make the device of the invention, including a plurality of pairs of straight, parallel source elements with respectively interposed gates and the like.

Figure 8A:
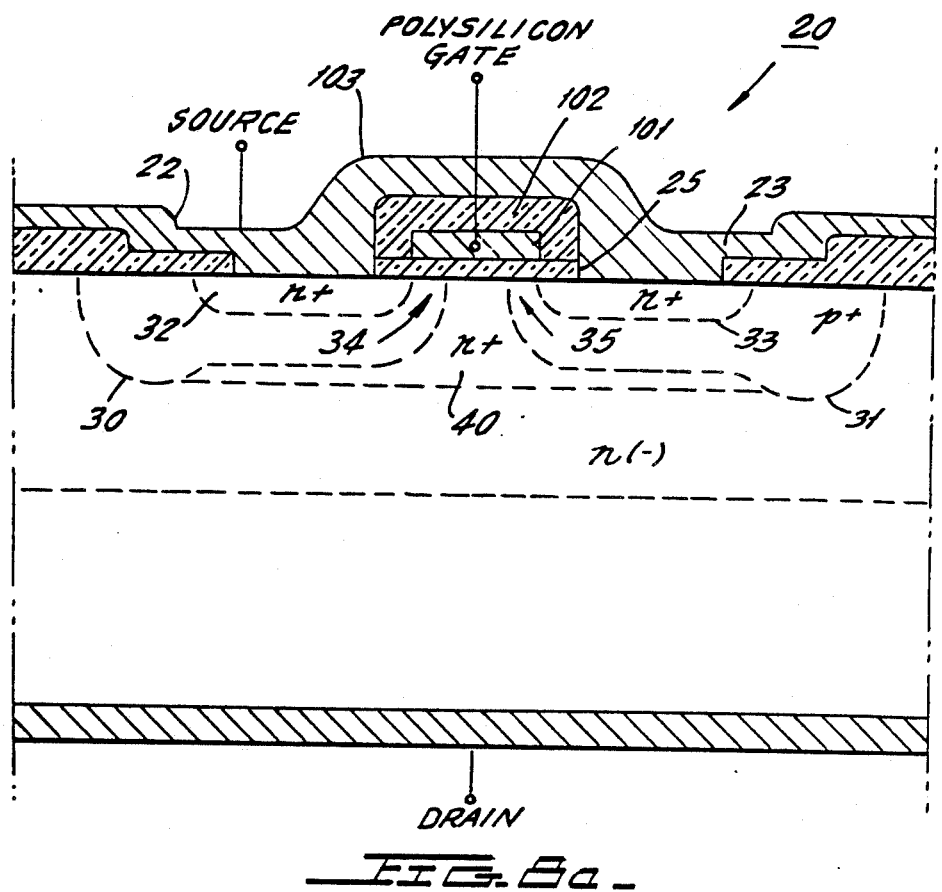
FIG. 8a is a view similar to FIG. 2 and shows a modified source contact configuration.

The source electrodes 22 and 23 have been shown as separate electrodes which can be connected to separate leads. Clearly, the sources 22 and 23 could be directly connected as shown in FIG. 8a where components similar to those of FIG. 2 have been given similar identifying numerals. In FIG. 8a, however, the gate electrode is a polysilicon layer 101 (in place of aluminum) deposited atop gate oxide 25. The gate 101 is then covered with oxide layer 102 and a conductive layer 103 connects the two sources 22 and 23 together to form a single source conductor which is insulated from gate 101. Connection is made to the gate at some suitable edge portion of the wafer.

FIGS. 9 and 10 show the shape of measured curves which demonstrate the reduction in forward resistance when the region 40 is made highly conductive (n+). In FIG. 9, the device tested had a region 40 which had the n(−) resistivity of the epitaxial region. Thus, the forward resistance is characteristically high at different gate biases as shown in FIG. 9.

In the device of the invention where region 40 is of n(+) conductivity, there is a dramatic decrease in the on-resistance as shown in FIG. 10 for all gate voltages before velocity saturation of the electrons occurs.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. The method of manufacture of a high power MOSFET device which comprises the steps of:
    (a) forming an insulation coating on the upper surface of a flat chip of a monocrystalline semiconductor of one of the conductivity types;
    (b) opening at least first and second spaced windows in said insulation coating which have at least first respective portions thereof which are elongated and parallel to one another;
    (c) applying impurity carriers of a conductivity type opposite said one conductivity type to said upper surface which is exposed by said first and second windows and heating said chip to cause said carriers to diffuse into said chip to form first and second respective regions of said opposite conductivity type in said chip which have a first depth;
    (d) opening at least third and fourth spaced windows in any insulation coating on said upper surface which are coextensive with and adjacent to said first and second windows; said third and fourth windows being disposed inwardly of the space between said first and second windows and being laterally removed from atop said first and second regions respectively;
    (e) applying impurity carriers of said opposite conductivity type to said upper surface which is exposed by said third and fourth windows and heating said chip to cause said carriers to diffuse into said chip to form third and fourth respective regions of said opposite conductivity type which are continuous with the adjacent sides of said first and second regions respectively but are shallower than said first and second regions; the opposite edges of parallel portions of said third and fourth regions being laterally diffused until they are spaced from one another by a given distance by a common neck region of said one conductivity type of said chip;
    (f) applying impurity carriers of said one conductivity type to said upper surface which is exposed by said third and fourth windows and heating said chip to cause said carriers from said one conductivity type to diffuse into said third and fourth regions for only a portion of the depth and width of said third and fourth regions to define first and second source regions; said first and second source regions having facing edges which are spaced from said common neck region, thereby to define first and second channel regions in said third and fourth regions respectively;
    (g) and forming an insulated gate means atop said upper surface and over said first and second channel regions, and forming source electrode means on said source regions and drain electrode means on the surface of said chip which is opposite said upper surface.

2. The method of claim 1 wherein said impurity carriers of said opposite conductivity type which are applied through said first and second windows, and said impurity carriers of said opposite conductivity type which are applied through said third and fourth windows, are each applied by ion implantation.

3. The method of claim 1 wherein said chip has an epitaxial layer thereon which extends to said upper surface and wherein all of said regions are contained within said epitaxial layer.

4. The method of manufacture of a high power MOSFET device which comprises the steps of:
    (a) forming an insulation coating on the upper surface of a flat chip of a monocrystalline semiconductor of one of the conductivity types;
    (b) opening at least first and second spaced windows in said insulation coating which have at least first respective portions thereof which are elongated and parallel to one another;
    (c) applying impurity carriers of a conductivity type opposite said one conductivity type to said upper surface which is exposed by said first and second windows and heating said chip to cause said carriers to diffuse into said chip to form first and second respective regions of said opposite conductivity type in said chip which have a first depth;
    (d) opening at least third and fourth spaced windows in said insulation coating on said upper surface which are coextensive with and adjacent to said first and second windows respectively; said third and fourth windows being disposed inwardly of the space between said first and second windows and being laterally removed from atop said first and second regions respectively;
    (e) applying impurity carriers of said one conductivity type to said upper surface through said third and fourth windows and heating said chip to cause said impurity carriers of said one conductivity type to diffuse into said chip to form relatively highly doped regions of said one conductivity type which spread laterally until they join one another in a common neck region beneath said insulation coating which is between said third and fourth windows;
    (f) applying impurity carriers of said opposite conductivity type to said upper surface which is exposed by said third and fourth windows and heating said chip to cause said carriers to diffuse into said chip to form third and fourth respective regions of said opposite conductivity type which are continuous with the adjacent sides of said first and second regions respectively but are shallower than said first and second regions; the opposite edges of parallel portions of said third and fourth regions being laterally diffused until they are spaced from one another by a given distance by said common neck region of said one conductivity type of said chip;

(g) applying impurity carriers of said one conductivity type to said upper surface which is exposed by said third and fourth windows and heating said chip to cause said carriers from said one conductivity type to diffuse into said third and fourth regions for only a portion of the depth and width of said third and fourth regions to define first and second source regions; said first and second source regions having facing edges which are spaced from said common neck region, thereby to define first and second channel regions in said third and fourth regions respectively;

(h) and forming an insulated gate means atop said upper surface and over said first and second channel regions, and forming source electrode means on said source regions and drain electrode means on the surface of said chip which is opposite said upper surface.

5. The method of claim 4 wherein said impurity carriers of said opposite conductivity type which are applied through said first and second windows, and said impurity carriers of said opposite conductivity type which are applied through said first and second windows, and said impurity carriers of said opposite conductivity type which are applied through said third and fourth windows, are each applied to said upper surface by ion implanation.

6. The method of claim 4 wherein said chip has an epitaxial layer thereon which extends to said upper surface and wherein all of said regions are contained within said epitaxial layer.

7. The method of claim 1, 2 or 3 wherein, following the step of forming said first and second regions of said opposite conductivity type, impurity carriers of said one conductivity type are applied to at least selected regions of said upper surface to cause impurities of said one conductivity type to diffuse into said chip to form relatively lightly doped regions of said one conductivity type which are disposed laterally within said common neck region and which extend to said upper surface of said chip.

* * * * *

# REEXAMINATION CERTIFICATE (2474th)

United States Patent [19]

Lidow et al.

[11] B1 4,705,759

[45] Certificate Issued  Feb. 14, 1995

[54] HIGH POWER MOSFET WITH LOW ON-RESISTANCE AND HIGH BREAKDOWN VOLTAGE

[75] Inventors: Alexander Lidow, Manhatta; Thomas Herman, Redondo, both of Calif.

[73] Assignee: International Rectifier Corporation, Los Angeles, Calif.

Reexamination Request:
No. 90/003,141, Jul. 26, 1993

Reexamination Certificate for:
Patent No.: 4,705,759
Issued: Nov. 10, 1987
Appl. No.: 456,813
Filed: Jan. 10, 1983

Related U.S. Application Data

[60] Division of Ser. No. 232,713, Feb. 9, 1981, Pat. No. 4,376,286, which is a continuation of Ser. No. 951,310, Oct. 13, 1978, abandoned.

[51] Int. Cl.[6] .................. H01L 21/265; H01L 21/31
[52] U.S. Cl. ........................... 437/29; 257/337; 257/339; 257/341; 257/342; 257/343; 437/30; 437/41; 437/149; 437/150; 437/153; 437/913; 437/931; 437/958; 437/984
[58] Field of Search .............. 437/29, 30, 41, 149, 437/150, 153, 913, 931, 958, 984; 257/337, 339, 341, 342, 343

[56] References Cited

U.S. PATENT DOCUMENTS

| | | | |
|---|---|---|---|
| 4,055,884 | 11/1977 | Jambotkar | 29/571 |
| 4,072,975 | 2/1978 | Ishitani | 357/23 |
| 4,190,850 | 2/1980 | Tihanyi et al. | 357/23 |

FOREIGN PATENT DOCUMENTS 2136509  11/1972  Germany.
50-46081  4/1975  Japan.
52-106688  9/1977  Japan.

OTHER PUBLICATIONS

Plummer et al., "Monolithic 200-V CMOS Analog Switch," *IEEE J. Solid-State Circuits*, vol. SC-11, No. 6, Dec. 1976.

Tarui et al., "Diffusion Self-Aligned MOST: A New Approach for High Speed Device," *J. of Japan Society of Applied Physics*, vol. 39, 1970.

Pocha, "High Voltage Double Diffused MOS Transistors for Integrated Circuits," *Stanford Electronics Laboratories Technical Report* No. 4956-1, Stanford University, Mar. 1976.

*Primary Examiner*—William G. Saba

[57] ABSTRACT

A high power MOSFET is disclosed in which two laterally spaced sources each supply current through respective channels in one surface of a semiconductor chip which are controlled by the same gate. The channels lead from the source electrodes to a relatively low resistivity region and from there to a relatively high resistivity epitaxially formed region which is deposited on a high conductivity substrate. The drain electrode may be either on the opposite surface of the chip or laterally displaced from and on the same side as the source regions. The epitaxially deposited semiconductor material immediately adjacent and beneath the gate and in the path from the sources to the drain has a relatively high conductivity, thereby to substantially reduce the on-resistance of the device without effecting the breakdown voltage of the device. The breakdown voltage of the device is substantially increased by forming a relatively deep p-type diffusion with a large radius in the n-type epitaxial layer beneath each of the sources.

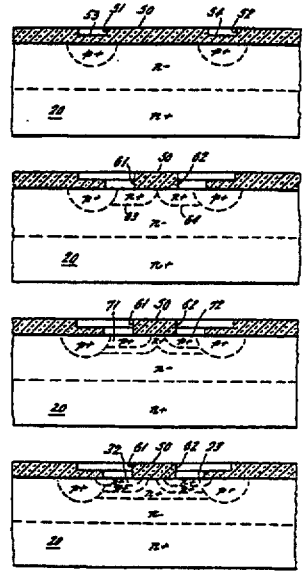

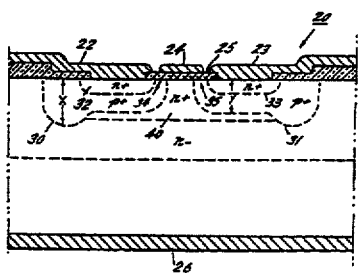

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 4–6 is confirmed.

Claim 1 is determined to be patentable as amended.

Claims 2, 3 and 7, dependent on an amended claim, are determined to be patentable.

1. The method of manufacture of a high power MOSFET device which comprises the steps of:
   (a) forming an insulation coating on the upper surface of a flat chip of a monocrystalline semiconductor of one [of the] conductivity [types] *type;*
   (b) opening at least first and second spaced windows in said insulation coating which have at least first respective portions thereof which are elongated and parallel to one another;
   (c) applying impurity carriers of a conductivity type opposite said one conductivity type to said upper surface which is exposed by said first and second windows and heating said chip to cause said carriers to diffuse into said chip to form first and second respective regions of said opposite conductivity type in said chip which have a first depth *and a relatively large radius of curvature to allow the device to withstand higher reverse voltages;*
   (d) opening at least third and fourth spaced windows in any insulation coating on said upper surface which are coextensive with and adjacent to said first and second windows; said third and fourth windows being disposed inwardly of the space between said first and second windows and being laterally removed from atop said first and second regions respectively;
   (e) applying impurity carriers of said opposite conductivity type to said upper surface which is exposed by said third and fourth windows and heating said chip to cause said carriers to diffuse into said chip to form third and fourth respective regions of said opposite conductivity type which are continuous with the adjacent sides of said first and second regions respectively but are shallower *and have a smaller radius of curvature* than said first and second regions; the opposite edges of parallel portions of said third and fourth regions being laterally diffused until they are spaced from one another by a given distance by a common neck region of said one conductivity type of said chip;
   (f) applying impurity carriers of said one conductivity type to said upper surface which is exposed by said third and fourth windows and heating said chip to cause said carriers from said one conductivity type to diffuse into said third and fourth regions for only a portion of the depth and width of said third and fourth regions to define first and second source regions; said first and second source regions having facing edges which are spaced from said common neck region, thereby to define first and second channel regions in said third and fourth regions respectively; *and*
   (g) [and] forming an insulated gate means atop said upper surface and over said first and second channel regions, and forming source electrode means on said source regions and drain electrode means on the surface of the chip which is opposite said upper surface.

* * * * *